(12) United States Patent
Lehmann et al.

(10) Patent No.: US 6,355,968 B1
(45) Date of Patent: Mar. 12, 2002

(54) WIRING THROUGH TERMINAL VIA FUSE

(75) Inventors: Gunther Lehmann, Poughkeepsie; Christoph Brintzinger, Fishkill, both of NY (US)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 09/638,722

(22) Filed: Aug. 10, 2000

(51) Int. Cl.⁷ .............................................. H01L 29/00
(52) U.S. Cl. ........................ 257/529; 257/758; 257/763; 438/132
(58) Field of Search ................................ 257/209, 529, 257/758, 763, 770, 773; 438/132, 467, 601

(56) References Cited

U.S. PATENT DOCUMENTS

| | | | | |
|---|---|---|---|---|
| 5,025,300 A | * | 6/1991 | Billig et al. | 257/529 |
| 5,235,205 A | * | 8/1993 | Bippitt, III | 257/528 |
| 5,550,399 A | * | 8/1996 | Okazaki | 257/529 |
| 5,589,706 A | * | 12/1996 | Mitwalsky et al. | 257/529 |
| 5,851,903 A | * | 12/1998 | Stamper | 438/467 |
| 5,949,323 A | * | 9/1999 | Huggins et al. | 337/401 |
| 5,986,319 A | * | 11/1999 | Huggins | 257/529 |
| 5,989,784 A | * | 11/1999 | Lee et al. | 430/316 |
| 6,121,073 A | * | 9/2000 | Huang et al. | 438/132 |
| 6,124,165 A | * | 9/2000 | Lien | 438/253 |
| 6,265,778 B1 | * | 7/2001 | Tottori | 257/758 |
| 6,288,436 B1 | * | 9/2001 | Narayan et al. | 257/529 |
| 6,303,970 B1 | * | 10/2001 | Lee et al. | 257/529 |

FOREIGN PATENT DOCUMENTS

| | | | | |
|---|---|---|---|---|
| JP | 4-3-235351 | * | 10/1991 | 257/311 |
| JP | 4-8-204015 | * | 8/1996 | H01L/21/82 |
| JP | 4-8-264654 | * | 10/1996 | H01L/21/82 |

OTHER PUBLICATIONS

K. Arndt et al., Reliability of Laser Activated Metal Fuses in DRAMs, 1999, IEEE, Int'l Electronics Manufacturing Technology Symposium, pp. 389–394.*

* cited by examiner

*Primary Examiner*—Eddie Lee
*Assistant Examiner*—George C. Eckert, II

(57) ABSTRACT

A semiconductor device, in accordance with the present invention, includes a plurality of fuses disposed on a same level in a fuse bank. A plurality of conductive lines are routed through the fuse bank in between the fuses. A terminal via window is formed in a passivation layer over the plurality of conductive lines and over the plurality of fuses, the terminal via window being formed to expose the fuses in the fuse bank.

21 Claims, 6 Drawing Sheets

WIRING THROUGH TERMINAL VIA FUSE

BACKGROUND

1. Technical Field

This disclosure relates to semiconductor fabricating and more particularly, to an area efficient wiring scheme through a terminal via window.

2. Description of the Related Art

Current semiconductor circuits employ laser fuses to permit different circuit configurations to adjust functionality after a circuit is fabricated. A laser fuse includes a conducting wire (e.g., made of aluminum, tungsten, polysilicon, etc.) that can be blown or opened up (i.e., open circuit) by a laser beam applied externally from the chip or circuit. In memory circuits, such as, for example, dynamic random access memories (DRAMs), fuses are typically used to activate and configure redundant elements of the memory array to fix fabrication failures and increase the overall production yield. Depending on the number and granularity of the redundant elements, a standard DRAM may include more than 10,000 laser fuses. Due to this large number, the fuses are arranged in a regular fashion in fuse banks to simplify the fuse blow process.

Since the fuses must be accessible from the outside, passivation layers on top of the fuses are removed by an etch process. This process step creates an opening through the passivation layer called a TV (terminal via) window. Due to the height of the passivation and due to the characteristics of the etch process, the TV window typically does not have very steep and clear cut edges. Therefore, a relatively large spacing between different TV windows must be maintained, as shown in FIG. 1.

Referring to FIG. 1, a cross section through two neighboring TV windows 10 and 12 is shown. A passivation layer 14 and an insulation layer 16 are opened up to form adjacent TV windows 10 and 12 and to expose laser fuses 16 (running perpendicular to the plane of the page). Laser fuses 16 are exposed to permit a laser beam to blow the appropriate fuses. Laser fuses 16 are formed on an insulating layer 18, which is a safe distance from a substrate 20.

Referring to FIG. 2, a top view of a typical layout with a TV window is shown. Wiring 22 is routed around a fuse bank 24. Wiring 22 is formed below passivation layer and is indicated in the FIGS. for illustrative purposes. This configuration suffers from a significant area penalty as a minimum distance is required from laser fuses 26 of fuse bank 24. Further, wiring 22 must not be exposed when opening up TV window 28. To ensure that wiring 22 avoids being exposed an even larger area penalty is incurred.

Passivation layer 14 on top of the semiconductor circuit protects the underlying circuits and wires from corrosion thus contributing to the circuit's reliability. Therefore, it is typically not recommended to use wiring or circuits inside the TV window except the laser fuses 26. As a consequence, all wiring must be routed around the TV windows 28 on the chip, which can cause a significant wiring overhead. This wiring overhead increases overall chip size, contributes to additional power consumption and slows down signal propagation due to the increased wiring parasitics (mainly resistance and capacitance).

Referring to FIG. 3, it is possible to split a TV window into two smaller TV windows 32 and 34, if cross wiring 36 is required. However, as outlined before a required spacing 38 between separate TV windows 32 and 34 would cause a significant area overhead. This is essentially the same as having two TV windows (FIG. 1).

Therefore, a need exists for an apparatus and wiring method for permitting wiring through a TV window, which reduces the area penalty associated with the prior art layouts.

SUMMARY OF THE INVENTION

A semiconductor device, in accordance with the present invention, includes a plurality of fuses disposed on a same level in a fuse bank. A plurality of conductive lines are routed through the fuse bank in between the fuses. A terminal via window is formed in a passivation layer over the plurality of conductive lines and over the plurality of fuses, the terminal via window being formed to expose the fuses in the fuse bank.

In other embodiments, the plurality of conductive lines may pass below the level of the fuses. The plurality of conductive lines may include a top layer of conductive lines that pass on the same level of the fuses, the top layer of conductive lines including a corrosion resistant material. The corrosion resistant material may include tungsten. The fuse bank may include a wiring area for the plurality of conductive lines to pass, wherein the fuses adjacent to the wiring areas are disposed in accordance with a distance of n times p, where n is an integer and p is a fuse pitch. The plurality of conductive lines may be spaced apart from the fuses to prevent damage during a fuse blow. The plurality of conductive lines may include a top layer of conductive lines that pass on above the level of the fuses, the top layer of conductive lines including a corrosion resistant material.

In still other embodiments, the semiconductor device may further include an insulation layer disposed over the plurality of conductive lines within the terminal via window, and a plate formed on the insulation layer directly over the plurality of conductive lines to protect the conductive lines. The plurality of conductive lines may include at least one layer of conductive lines that are disposed above the level of the fuses, the at least one layer of conductive lines including a corrosion resistant material. The semiconductor device may include an insulation layer supporting the at least one layer of conductive lines within the terminal via window. The plurality of conductive lines may be included in a plurality of different levels.

A semiconductor device, in accordance with the present invention, includes a plurality of fuses disposed on a same level in a fuse bank, and a plurality of conductive lines routed through the fuse bank in between the fuses, the plurality of conductive lines including conductive lines on the same level of the fuses, below the level of the fuses and above the level of the fuses. A passivation layer is formed over the level of the fuse bank and the plurality of conductive lines, and a terminal via window is formed in the passivation layer over a portion of the plurality conductive lines and over the fuse bank, the terminal via window being formed to expose the fuses in the fuse bank.

In alternate embodiments, the plurality of conductive lines may include a first and a second layer of conductive lines. The first layer of conductive lines is disposed above the level of fuses, and the second layer of conductive lines is disposed on the same level of the fuses. The first and second layers of conductive lines include a corrosion resistant material. The corrosion resistant material may include tungsten. The fuse bank may include a wiring area for the plurality of conductive lines to pass, wherein the fuses adjacent to the wiring areas are disposed in accordance with a distance of n times p, where n is an integer and p is a fuse pitch. The plurality of conductive lines are preferably spaced apart from the fuses to prevent damage during a fuse blow.

The semiconductor device may include an insulation layer disposed over the plurality of conductive lines within the terminal via window above the level of the fuses, and a plate formed on the insulation layer directly over the plurality of conductive lines to protect the conductive lines. The plurality of conductive lines are preferably included in a plurality of different levels.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention provides several new methods to implement an area efficient wiring through a terminal via (TV) fuse window without sacrificing the reliability of the circuit. The present invention permits wiring through the TV window while addressing area penalty and corrosion resistance issues. The present invention will be described in terms of illustrative embodiments; however, the present invention is not limited to the illustrative examples and may be employed with other layouts and wiring schemes.

Figure 1:
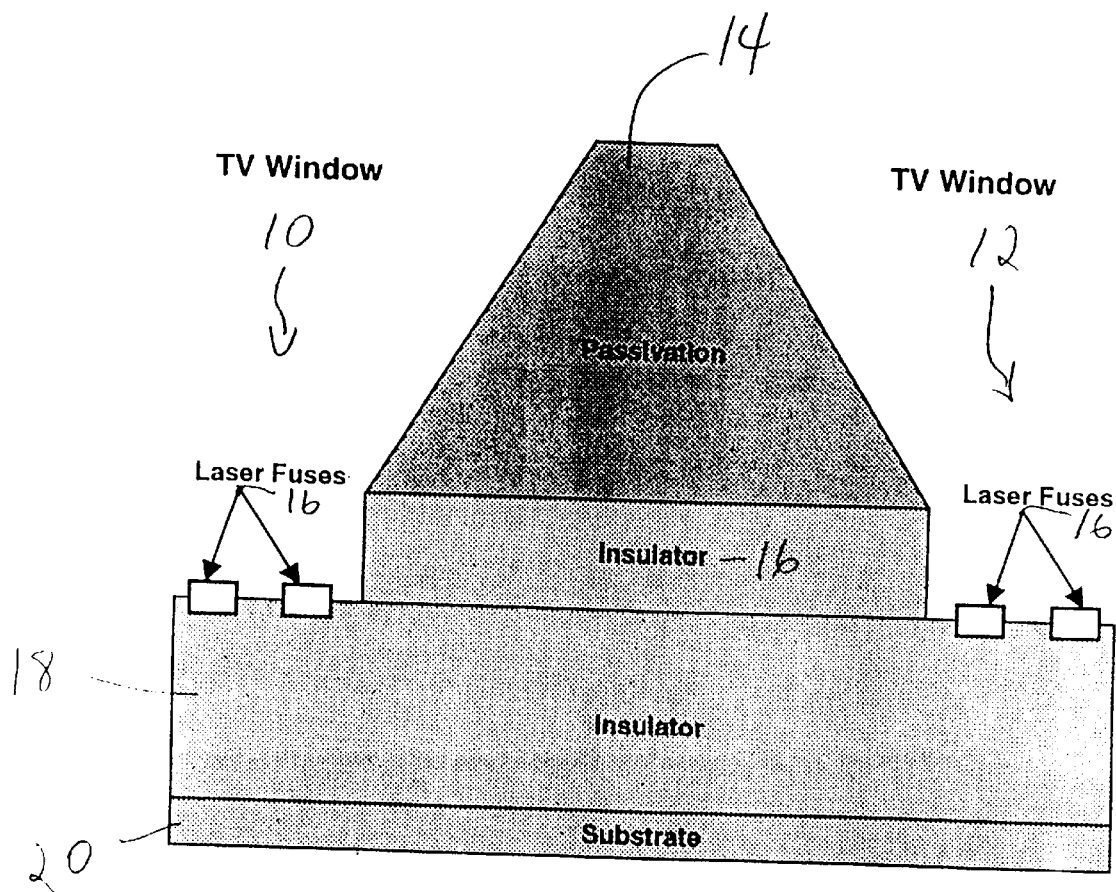
FIG. 1 is a cross-sectional view showing a spacing between terminal via (TV) windows due to passivation layer thickness in accordance with the prior art.
Figure 3:
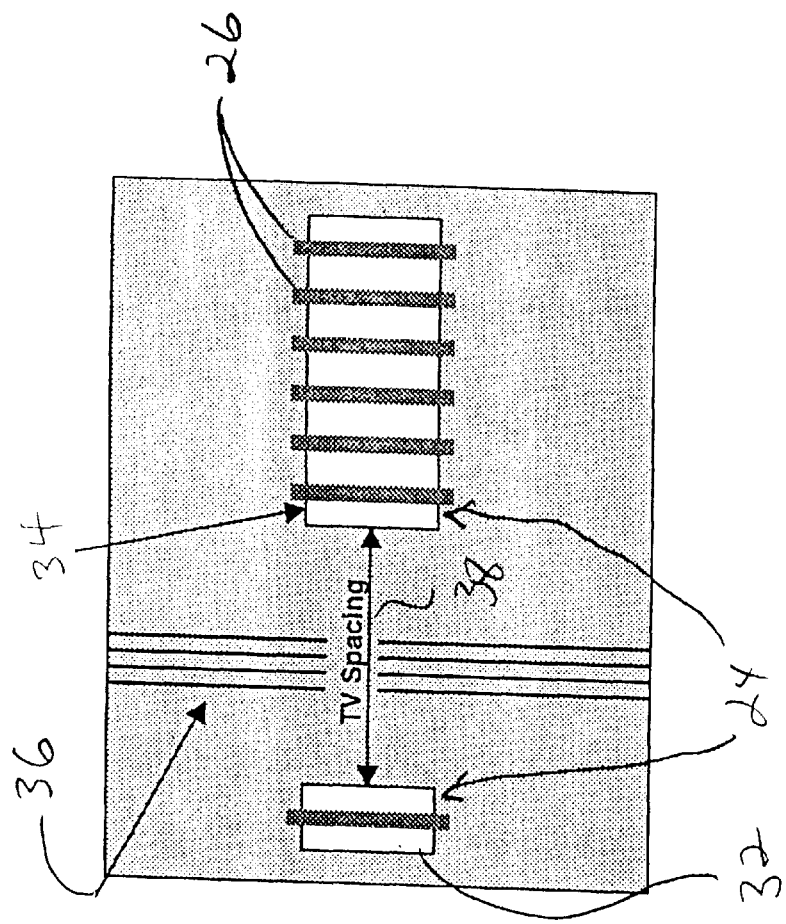
FIG. 3 is a top view of a split terminal via (TV) window suffering from an area penalty due to TV spacing between the split portions in accordance with the prior art.
Figure 2:
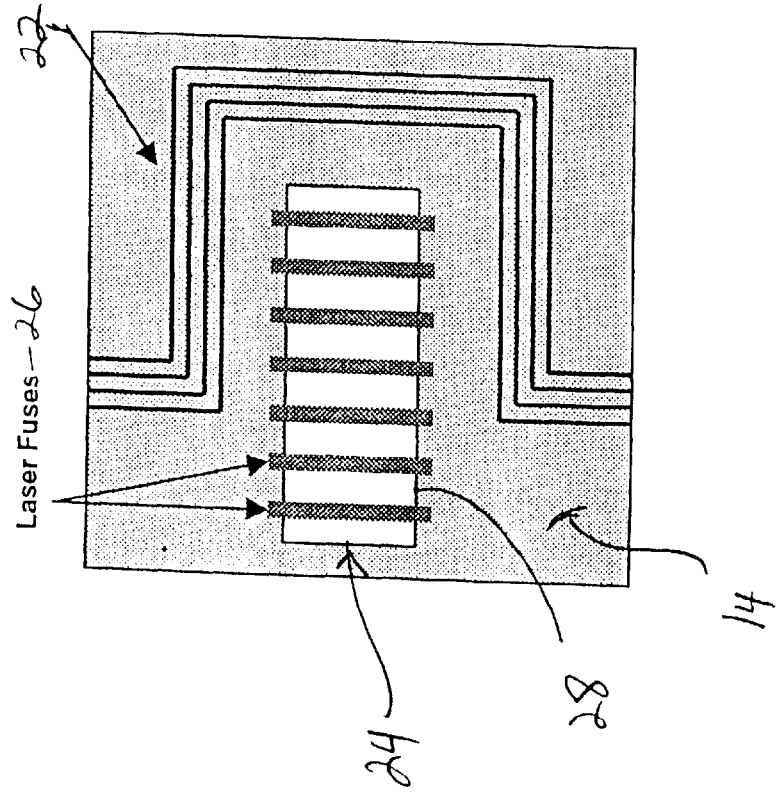
FIG. 2 is a top view of a terminal via (TV) window where wires are routed around the TV window in accordance with the prior art.
Figure 4:
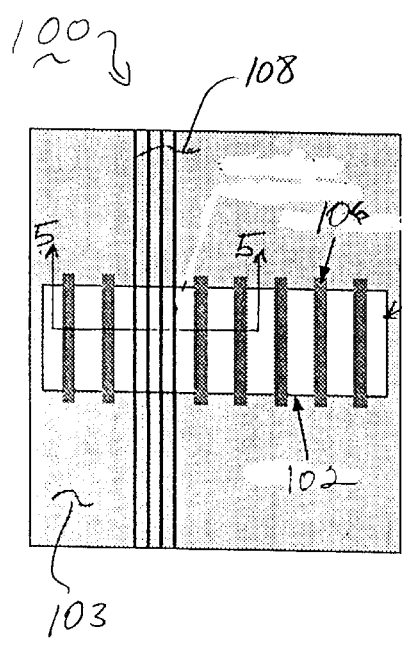
FIG. 4 is a top schematic view of a semiconductor device showing wiring through a TV window in accordance with one embodiment of the present invention.
Figure 5:
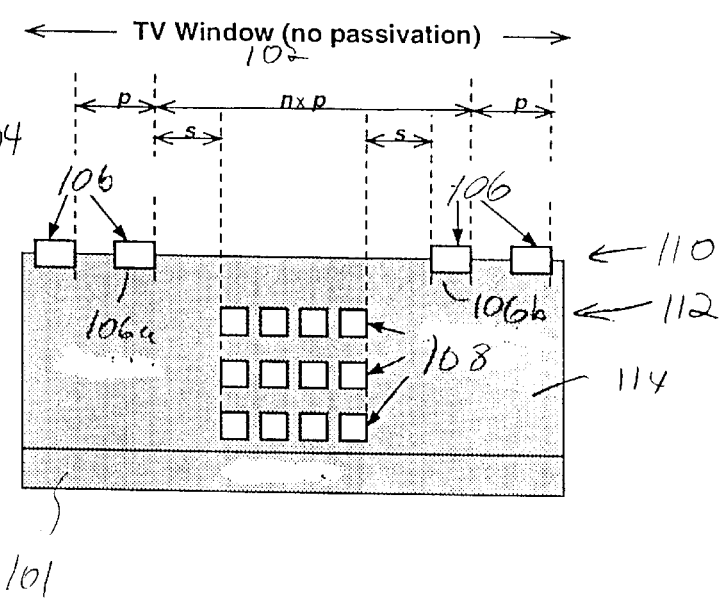
FIG. 5 is a cross-sectional view taken at section lines 5—5 of FIG. 4 showing conductive lines below a fuse level in accordance with the present invention.

Referring now in specific detail to the drawings in which like reference numerals identify similar or identical elements throughout the several views, and initially to FIGS. 4 and 5, a wiring scheme through a TV (terminal via) window on lower level conductors is shown. Wiring is illustrated throughout the FIGS. to depict its routing through the TV window. This wiring in some cases would otherwise be obscured from view by a passivation layer and/or insulation layer. FIG. 4 depicts a top view of semiconductor device or chip 100. Semiconductor device 100 may include a memory device, such as a DRAM or a processor, or any other device, which employs fuses. A TV window 102 is opened over a fuse bank 104 by etching a passivation layer 103. Fuse bank 104 preferably includes laser blowable fuses 106 although other fuse types may benefit by the present invention as well. Advantageously, wiring 108 passes through TV window 102. FIG. 5 is a cross-section taken at section line 5—5 of FIG. 4. As shown in FIG. 5, laser fuses 106 are implemented on a level 110 that is at least one level higher than a highest conductor level 112 of cross wiring 108. The TV window etch is stopped at level 110 of the laser fuse wires 106. All conductor levels for wiring 108 are below this level and are covered by an insulator 114. Insulator 114 largely reduces the risk of damage to cross wiring 108, which may be caused by corrosion or by blowing fuses. A substrate 101 may include a semiconductor substrate with a plurality of structures and/or components formed thereon or therein.

Cross wiring 108 is implemented such that a minimum distance s is maintained between each of two laser fuses 106a and 106b to the left and right, respectively, of cross wiring 108. In a preferred embodiment, a distance is maintained between laser fuses 106a and 106b which is preferably a multiple n of the laser fuse pitch p (e.g., n×p as indicated in FIG. 5).

As a result, a laser fuse tool (not shown) can operate in steps of pitch multiples which simplifies the programming of the tool and reduces fusing costs. Those fuse locations that are not actual fuses but cross wiring are instead programmed as fuses that should not be blown. The laser fuse tool can simply skip over the n×p area. Advantageously, by treating the area over cross wiring 108 as fuses that are never blown, the existing fusing process remains unchanged.

As mentioned, cross wiring 108 is maintained at a certain safety distance s to the adjacent laser fuses to ensure that the cross wiring 108 is not affected by the laser beam when blowing one of the neighboring fuses. Inside the cross wiring region, a smaller wire pitch may be used for area efficiency.

Compared to the prior art, this embodiment of the present invention significantly reduces the area penalty of the prior art since the safety margin 2×s (where s is, for example, about 1.5 microns) is much smaller than the TV window spacing (about 20 microns). Reliability is not affected because wires 108 are covered by insulator 114.

Figure 6:
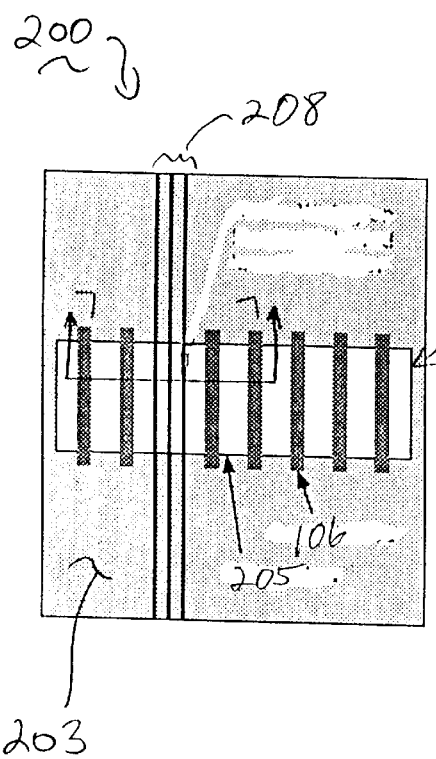
FIG. 6 is a top schematic view of a semiconductor device showing wiring through a TV window in accordance with another embodiment of the present invention.
Figure 7:
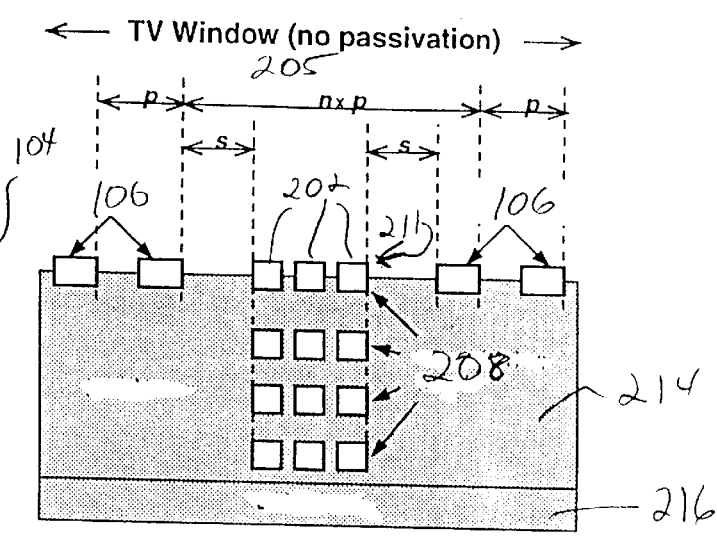
FIG. 7 is a cross-sectional view taken at section lines 7—7 of FIG. 6 showing conductive lines formed below a fuse level and at a same level of the fuse level in accordance with the present invention.

Referring to FIGS. 6 and 7, another embodiment of the present invention includes wiring through a TV window with corrosion resistant conductors on a top level of the wiring. A semiconductor device 200 may include a memory device, such as a DRAM, a processor, or any other device, which employs fuses. An insulator 214 is provided on a substrate 216. Substrate 216 may include a semiconductor substrate with a plurality of structures and/or components formed thereon or therein. Wiring 208 includes a layer of conductive wires having wires 202, which may be exposed during the removal of a portion of passivation layer 203 to open a TV window 205 therein. A fuse bank 104 includes fuses 106. Wires 202 include a conductive material, employed on the laser fuse level that is not susceptible to corrosion, such as, for example, tungsten or tungsten silicide.

Advantageously, area efficiency of cross wiring 208 is increased by adding additional wiring levels 211. Instead of four wiring channels on three levels, as shown in FIG. 5, three wiring channels on four levels are employed by including wires 202 on the laser fuse level. Reliability is not affected for wiring 202, since a non-corroding material is used for cross wiring on the fuse level.

Figure 8:
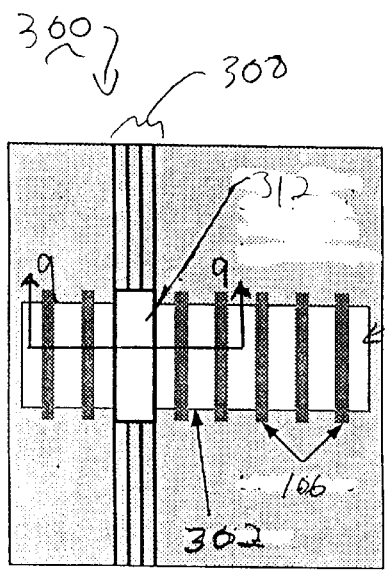
FIG. 8 is a top schematic view of a semiconductor device showing wiring through a TV window in accordance with yet another embodiment of the present invention.
Figure 9:
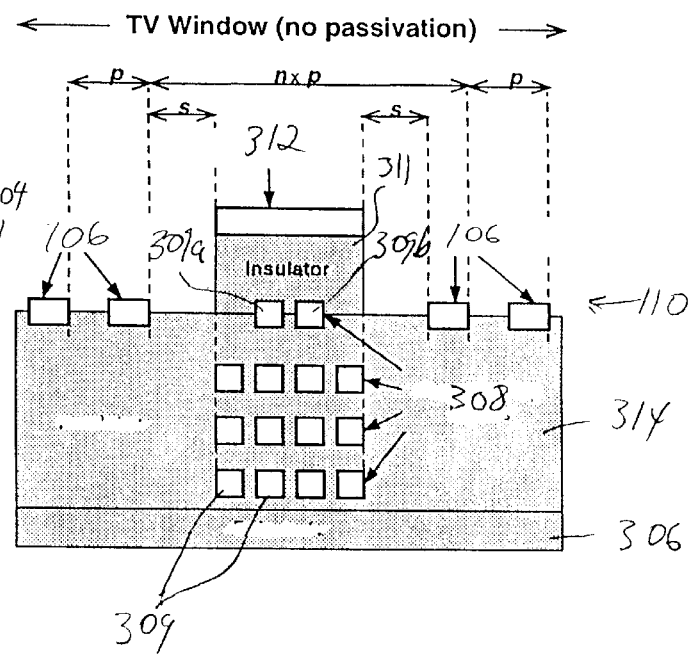
FIG. 9 is a cross-sectional view taken at section lines 9—9 of FIG. 8 showing conductive lines protected by an insulating cap and a plate in accordance with the present invention.

Referring to FIGS. 8 and 9, another embodiment of the present invention includes wiring through a TV window by employing a conductor and an insulator cap. A semiconductor device 300 may include a memory device, such as a DRAM, a processor, or any other device, which employs fuses. An insulator 314 is provided on a substrate 306. Substrate 306 may include a semiconductor substrate with a plurality of structures and/or components formed thereon or therein. Wiring 308 includes a plurality of conductive lines 309. Conductive lines 309a and 309b are formed on a same level as fuses 106 of fuse bank 104.

An insulator 311 is formed over conductors 309a and 309b. A plate 312 is formed on insulator 311 on any conductor level higher than laser fuse level 110. Plate 312 is employed to protect insulator stack 311 on top of cross wiring 308 during a passivation/insulator open process. Plate 312 protects the insulator material 311 below plate 312 during the etch open process of TV window 302. No additional lithographic step is needed since any of the existing higher level conductors can be used to define the insulator stack. One advantage of this embodiment is that cross wiring 308 on the laser fuse level 110 is covered by insulator material 311. Therefore, a conductor material that may be affected by corrosion (e.g., aluminum) may be employed for conductors 309a and 309b without jeopardizing the circuit's reliability. Advantageously, wires 308 are routed between fuses 106 on a same level without the area penalty associated with the prior art.

Figures 10, 11:
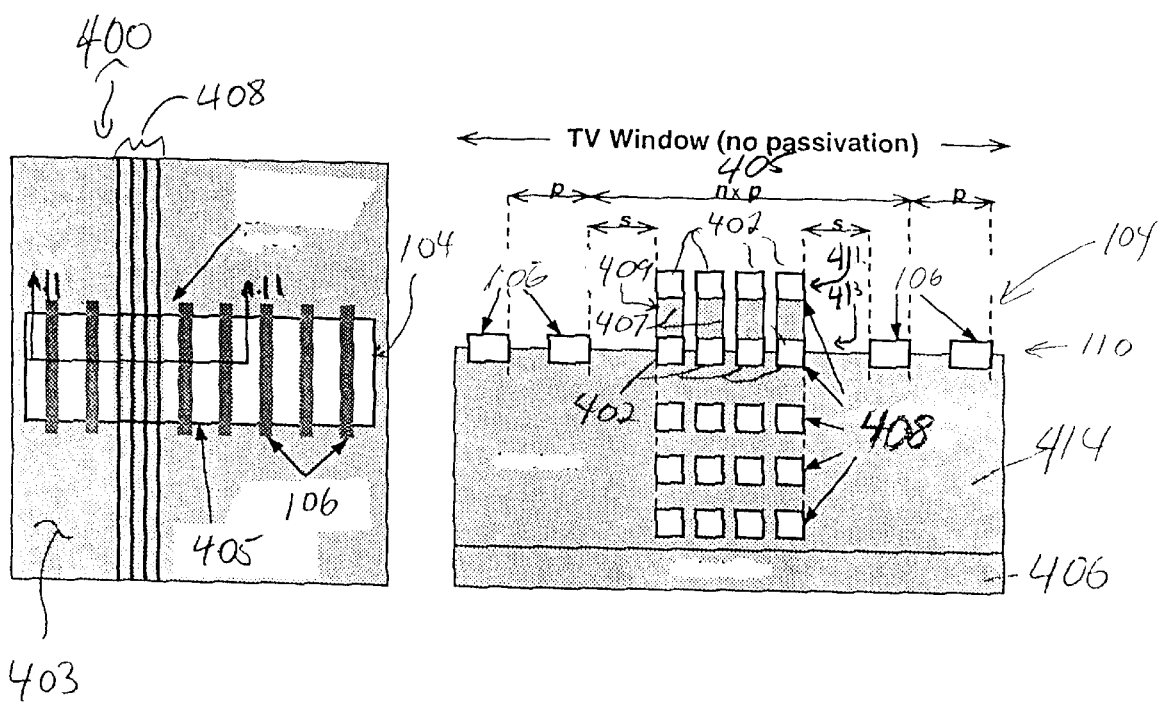
FIG. 10 is a top schematic view of a semiconductor device showing wiring through a TV window in accordance with still another embodiment of the present invention.
FIG. 11 is a cross-sectional view taken at section lines 11—11 of FIG. 10 showing conductive lines formed above, below and at a fuse level in accordance with the present invention.

Referring to FIGS. 10 and 11, yet another embodiment of the present invention includes wiring through a TV window with corrosion resistant conductors on multiple levels. A semiconductor device 400 may include a memory device, such as a DRAM, a processor, or any other device, which employs fuses. An insulator 414 is provided on a substrate 406. Substrate 406 may include a semiconductor substrate with a plurality of structures and/or components formed thereon or therein. Wiring 408 includes a layer of conductive wires having wires 402, which may be exposed during the removal of a portion of passivation layer 403 to open a TV window 405 therein. A fuse bank 104 includes fuses 106. Wires 402 include a conductive material, employed on the laser fuse level and above the laser fuse level which is not susceptible to corrosion, such as, for example, tungsten or tungsten silicide.

Advantageously, area efficiency of cross wiring 408 is increased by adding additional wiring levels 411 and 413. Four wiring channels on six levels are employed by including wires 402 on the laser fuse level and above the laser fuse level.

Conductive materials on the fuse level and on the conductor level above the fuse level are resistant against corrosion, e.g. made of tungsten or tungsten silicide. This means that wires 402 need not to be covered by an insulator. An insulator 407 is employed to form stacks of conductive wires 402. Advantageously, conductor levels above the fuse level can be used for the cross wiring. Due to the etch process for TV window 405, the top level wires of the cross wiring are now located on top of insulator stacks 409. These insulator stacks are formed during the TV window etch. Wires 402 on a top conductor level 412 withstand this etching (for example, anisotropic etching) forming stacks 409. This embodiment has the highest area efficiency since it supports the highest number of cross wiring levels.

It is to be understood that additional wiring layers may be employed above the fuse layer by employing stacks 409 on multiple levels. It is further to be understood that wiring through a TV window may combine one or more of the illustrative embodiments described herein. For example, multiple wiring layers may be employed above the fuse layer by employing a plate (e.g., FIG. 9) over the multiple wiring layers. Other combinations and variations are also contemplated.

Having described preferred embodiments for wiring through a terminal via fuse window (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device comprising:
   a plurality of fuses disposed on a same level in a fuse bank;
   a plurality of conductive lines routed through the fuse bank in between the fuses; and
   a terminal via window formed in a passivation layer over a portion of the plurality of conductive lines and over the plurality of fuses, the terminal via window being formed to expose the fuses in the fuse bank.

2. The semiconductor device as recited in claim 1, wherein the plurality of conductive lines pass below the level of the fuses.

3. The semiconductor device as recited in claim 1, wherein the plurality of conductive lines include a top layer of conductive lines that pass on the same level of the fuses, the top layer of conductive lines including a corrosion resistant material.

4. The semiconductor device as recited in claim 3, wherein the corrosion resistant material includes tungsten.

5. The semiconductor device as recited in claim 1, wherein the fuse bank includes a wiring area for the plurality of conductive lines to pass, wherein the fuses adjacent to the wiring areas are disposed in accordance with a distance of n times p, where n is an integer and p is a fuse pitch.

6. The semiconductor device as recited in claim 1, wherein the plurality of conductive lines are spaced apart from the fuses to prevent damage during a fuse blow.

7. The semiconductor device as recited in claim 1, wherein the plurality of conductive lines include a top layer of conductive lines that pass on above the level of the fuses, the top layer of conductive lines including a corrosion resistant material.

8. The semiconductor device as recited in claim 1, further comprising:
   an insulation layer disposed over the plurality of conductive lines within the terminal via window;

a plate formed on the insulation layer directly over the plurality of conductive lines to protect the conductive lines.

9. The semiconductor device as recited in claim 1, wherein the plurality of conductive lines include at least one layer of conductive lines that are disposed above the level of the fuses, the at least one layer of conductive lines including a corrosion resistant material.

10. The semiconductor device as recited in claim 9, further comprising:

an insulation layer supporting the at least one layer of conductive lines within the terminal via window.

11. The semiconductor device as recited in claim 1, wherein the plurality of conductive lines are included in a plurality of different levels.

12. A semiconductor device comprising:

a plurality of fuses disposed on a same level in a fuse bank;

a plurality of conductive lines routed through the fuse bank in between the fuses, the plurality of conductive lines including conductive lines on the same level of the fuses, below the level of the fuses and above the level of the fuses;

a passivation layer formed over the level of the fuse bank and the plurality of conductive lines; and a terminal via window formed in the passivation layer over a portion of the plurality conductive lines and over the fuse bank, the terminal via window being formed to expose the fuses in the fuse bank.

13. The semiconductor device as recited in claim 12, wherein the plurality of conductive lines include a first and a second layer of conductive lines, the first layer of conductive lines disposed above the level of fuses and the second layer of conductive lines disposed on the same level of the fuses, the first and second layers of conductive lines including a corrosion resistant material.

14. The semiconductor device as recited in claim 13, wherein the corrosion resistant material includes tungsten.

15. The semiconductor device as recited in claim 12, wherein the fuse bank includes a wiring area for the plurality of conductive lines to pass, wherein the fuses adjacent to the wiring areas are disposed in accordance with a distance of n times p, where n is an integer and p is a fuse pitch.

16. The semiconductor device as recited in claim 12, wherein the plurality of conductive lines are spaced apart from the fuses to prevent damage during a fuse blow.

17. The semiconductor device as recited in claim 12, further comprising:

an insulation layer disposed over the plurality of conductive lines within the terminal via window above the level of the fuses; and a plate formed on the insulation layer directly over the plurality of conductive lines to protect the conductive lines.

18. The semiconductor device as recited in claim 12, wherein the plurality of conductive lines are included in a plurality of different levels.

19. A semiconductor device comprising:

a plurality of fuses disposed on a same level of a fuse bank;

a plurality of conductive lines routed through the fuse bank in between the fuses, the plurality of conductive lines including conductive lines on the same level of the fuses, below the level of the fuses and above the level of the fuses;

a passivation layer formed over the fuse bank and the plurality of conductive lines; and a terminal via window formed in the passivation layer over the plurality conductive lines, the terminal via window being formed to expose the fuses in the fuse bank;

an insulation cap encapsulating the conductive lines formed on the same level and above the level of the fuses within the terminal via window; and a plate formed on the insulation cap and over the conductive lines.

20. The semiconductor device as recited in claim 19, wherein the fuse bank includes a wiring area for the plurality of conductive lines to pass, wherein the fuses adjacent to the wiring areas are disposed in accordance with a distance of n times p, where n is an integer and p is a fuse pitch.

21. The semiconductor device as recited in claim 19, wherein the plurality of conductive lines are spaced apart from the fuses to prevent damage during a fuse blow.

* * * * *